(12) United States Patent
Herner et al.

(10) Patent No.: US 6,635,556 B1
(45) Date of Patent: Oct. 21, 2003

(54) METHOD OF PREVENTING AUTODOPING

(75) Inventors: Scott B. Herner, Palo Alto, CA (US); James M. Cleeves, Redwood City, CA (US); Johan Knall, Sunnyvale, CA (US)

(73) Assignee: Matrix Semiconductor, Inc., Santa Clara, CA (US)

(*) Notice: Subject to any disclaimer, the term of this patent is extended or adjusted under 35 U.S.C. 154(b) by 0 days.

(21) Appl. No.: 09/859,282

(22) Filed: May 17, 2001

(51) Int. Cl.[7] .............................................. H01L 21/20
(52) U.S. Cl. ....................................... 438/488; 438/916
(58) Field of Search ................................ 438/916, 253, 438/254, 488, 558, 489, 508, 96, 37; 117/84, 96, 935

(56) References Cited

U.S. PATENT DOCUMENTS

| | | | | |
|---|---|---|---|---|
| 3,716,422 A | * | 2/1973 | Ing et al. | |
| 3,775,197 A | * | 11/1973 | Sahagun | |
| 4,662,956 A | | 5/1987 | Roth et al. | |
| 4,704,624 A | | 11/1987 | Yamazaki et al. | |
| 4,894,349 A | * | 1/1990 | Saito et al. | |
| 5,081,066 A | * | 1/1992 | Kim | |
| 5,324,685 A | | 6/1994 | Hirtz et al. | |
| 5,571,329 A | | 11/1996 | Chan et al. | |
| 5,821,158 A | * | 10/1998 | Shishiguchi | 438/528 |
| 5,877,072 A | * | 3/1999 | Andideh | |
| 5,906,680 A | | 5/1999 | Meyerson | |
| 5,940,733 A | * | 8/1999 | Beinglass et al. | 438/655 |
| 6,007,624 A | * | 12/1999 | Wise | 117/96 |
| 6,069,053 A | * | 5/2000 | Ping et al. | |
| 6,096,626 A | * | 8/2000 | Smith et al. | |
| 6,107,137 A | * | 8/2000 | Fazan et al. | 438/253 |
| 6,124,545 A | | 9/2000 | Bauer et al. | |
| 6,187,628 B1 | * | 2/2001 | Thakur et al. | 438/255 |
| 6,214,705 B1 | * | 4/2001 | Ting | 438/482 |
| 6,238,969 B1 | * | 5/2001 | Figura et al. | 438/254 |
| 6,255,159 B1 | * | 7/2001 | Thakur et al. | 438/253 |
| 6,297,528 B1 | * | 10/2001 | Chen et al. | 438/592 |
| 6,316,310 B1 | * | 11/2001 | Wensley | |
| 6,338,872 B1 | | 1/2002 | Yoshino et al. | |
| 2001/0009303 A1 | * | 7/2001 | Tang et al. | 257/758 |

OTHER PUBLICATIONS

Slective etching Technology of in–situ P–doped poly–Si(SEDOP) for high density DRAM capacitors, 1994 Symposium on VLSI Technology Digest of Technical papars, pp25–26.*

* cited by examiner

*Primary Examiner*—Savitri Mulpuri
(74) *Attorney, Agent, or Firm*—Calfee, Halter & Griswold; Nenad Pejic; Pamela J. Squyers

(57) ABSTRACT

A method of making a silicon-based electronic device is provided. The method includes, for example, the steps of forming a doped silicon layer on a surface of a substrate material and forming an undoped silicon capping layer on the doped silicon layer. The thin "capping" layers of undoped silicon prevent outgassing of the dopants underneath the cap. In this manner, the next deposition of doped silicon is not subject to autodoping by the previous doped silicon deposition.

23 Claims, 3 Drawing Sheets

METHOD OF PREVENTING AUTODOPING

FIELD OF THE INVENTION

The invention relates generally to electronic devices and, more particularly, to methods of reducing or eliminating the effects of autodoping in chemical vapor deposition (hereinafter CVD) processes.

BACKGROUND OF THE INVENTION

Many steps in integrated circuit (IC) manufacture require the deposition of thin films of silicon. One method of depositing silicon in thin film form is by low pressure chemical vapor deposition (hereinafter LPCVD). Substrate wafers are heated in a pressure vessel to between 450 and 650° C. while atmospheric gases are pumped out. When the pressure in the vessel generally reaches between 200–600 mTorr and the wafers have reached high temperature, a silicon containing gas such as silane ($SiH_4$) is flowed into the chamber, resulting in silicon deposition. Excellent control of the thickness of the film, thickness uniformity across a wafer, and step coverage (i.e., ability to cover a wafer surface with varied topography) is achieved by adjusting the temperature, pressure, and gas flow in the pressure vessel.

However, many steps in integrated circuit manufacture not only require the deposition of thin films of silicon, but also require that the thin film be doped to make it conductive. Doping describes intentionally contaminating the silicon with specific foreign atoms, such as boron or phosphorus. The most common method of doping silicon is by ion implantation. Ion implantation is a process by which foreign atoms are ionized, accelerated by electromagnetic fields, and directed to impact ("implant") into a target substrate such as silicon. Ion implantation requires expensive equipment and does not allow for good control over the concentration depth profile of the dopant.

Another method of doping silicon thin films is to co-deposit dopant atoms while depositing silicon atoms. Precursor gases such as boron trichloride ($BCl_3$) or phosphine ($PH_3$) are admitted simultaneously with silane ($SiH_4$) resulting in boron or phosphorus doped silicon films. This process is generally known as "in-situ" doping. In-situ doping allows for better control of the dopant depth profile concentration in the silicon film relative to ion implantation. Cost is also reduced as silicon film deposition and doping is done using the same furnace.

However, one major drawback of in-situ doping is the potential for autodoping. Autodoping is the unintentional doping of wafers in a vessel caused by the outgassing of dopant atoms in the silicon films from the previous deposition. When silicon wafers are deposited in an LPCVD method, the vessel and everything inside it (including any dummy wafers used for maintaining consistent deposition on product wafers) are all deposited with silicon film and, if any is present, dopant material. The silicon deposition is ubiquitous and indiscriminate on all heated surfaces in the pressure vessel.

Several prior art methods attempt to reduce or eliminate the effects of autodoping. One such method is to "wet" clean all the components of the LPCVD furnace. This requires shutting down the LPCVD furnace, removing any product wafers and using a chemical bath to etch away the doped layers formed on the LPCVD furnace components. This process is sometimes repeated after every product wafer deposition. This method is highly disadvantageous because LPCVD furnaces are notorious for their large overhead times. Overhead time is the time spent by the LPCVD furnace which is not dedicated strictly to product wafer depositions and includes the time to pump down the pressure vessel to low pressures, the time for the wafers to achieve a uniform process temperature, the time to cool down the wafers before they can be placed in plastic cassettes, etc. In some cases, the overhead time on LPCVD deposition sequences is on the order of four or more hours and is, therefore, nontrivial.

A second method is to "dry" clean all the components of the LPCVD furnace. This method involves once again effectively shutting down the LPCVD furnace, removing any product wafers and then pumping gaseous cleaning agents into the LPCVD furnace to etch away the doped layers formed therein. This process is also sometimes repeated after every product wafer deposition. This method also suffers from the above-discussed disadvantageously large overhead times because the LPCVD furnace must be effectively shut down (e.g., placed in a nonproductive operational state) to be cleaned and then restarted for the next product wafer deposition.

A third method is to run a separate and distinct undoped deposition process that is unrelated to the product wafer deposition process. This method requires removal of the product wafers from the furnace and then running a separate and distinct undoped deposition process to coat all of the surfaces of the LPCVD furnace components (and, if any, dummy wafers). This process-is also sometimes repeated after every product wafer deposition. Since the product wafers are not in the furnace during this deposition, large overhead times as discussed above are once again encountered because the LPCVD furnace must be effectively placed in nonproductive operation and restarted multiple times before the product wafer depositions can be once again formed.

Hence, a method of preventing autodoping that does not suffer from the aforementioned disadvantages is highly desirable.

SUMMARY OF THE INVENTION

The present invention employs very thin "capping" layers of undoped silicon that are deposited on top of the doped silicon layers of product wafers and/or dummy wafers to prevent outgassing of the dopants underneath the cap. In this regard, while the undoped capping layers may have some dopant in them due to out-gassing and diffusion from the doped layer below and the pressure vessel, the amount of dopant present is so low that the next product wafer deposition of doped silicon is not subject to autodoping by the previous doped silicon deposition.

According to one embodiment of the present invention, a continuous method of making a silicon-based electronic device is provided. The method includes, for example, the steps of forming a doped silicon layer on a surface of a substrate material and forming an undoped silicon capping layer on the doped silicon layer. A second doped silicon layer may be formed on the undoped silicon layer followed by another doped silicon capping layer, and so, on. In this manner, the undoped silicon capping layers prevent autodoping from the doped silicon layers beneath. The entire method is performed via a continuous in-situ process without having the LPCVD furnace in any nonproductive operational states between depositions.

For example, for a 1000 Å phosphorus-doped (ntype) silicon layer, an undoped silicon capping layer having a thickness of approximately 200 Å or greater is sufficient to reduce the effects of autodoping to most preferably a substantially background level. Also, for a 1000 Å boron-doped (p-type) silicon layer, an undoped silicon capping layer having a thickness of approximately 300 Å or greater is sufficient to reduce the effects of autodoping to most preferably a substantially background level.

Therefore, it is an advantage of the present invention to provide a continuous process for forming electronic devices that does not suffer from the drawbacks associated with autodoping.

It is yet another advantage of the present invention to provide a method of reducing autodoping wherein the capping layer can be used for subsequent processing such as, for example, the formation of wires or use during chemomechanical polishing (CMP).

It is still further an advantage of the present invention to provide a method reducing autodoping to substantially background concentrations.

It is still further an advantage of the present invention to provide a method of fabricating electronic devices with abrupt n and p-type interfaces.

BRIEF DESCRIPTION OF THE DRAWINGS

In the accompanying drawings which are incorporated in and constitute a part of the specification, embodiments of the invention are illustrated, which, together with a general description of the invention given above, and the detailed description given below, serve to example the principles of this invention.

FIGS. 1A–1D illustrate the fabrication of an electronic device according to the present invention.

DETAILED DESCRIPTION OF ILLUSTRATED EMBODIMENT

Figure 1A:
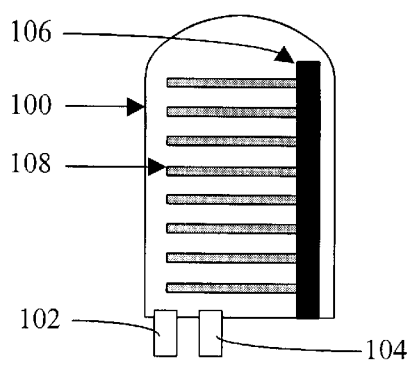

FIGS. 1A through 1D illustrate a continuous process for forming an electronic device that prevents or minimizes autodoping. Referring now to FIG. 1A, a pressure vessel 100 is provided and generally includes at least two input ports 102 and 104 for the input of various source gases. As will be described in more detail hereinafter, the source gases are used to form the deposition layers of the present invention. The pressure vessel 100 is preferably in the form of a quartz tube. The pressure vessel 100 further has openings (not shown) for inserting and removing product and dummy (if any) wafer assemblies and exit ports for purging the gaseous contents therein. The pressure vessel 100 is also connected to vacuum pumps with valving systems to regulate pressure (not shown). Additionally, the temperature inside the pressure vessel is generally controlled by heating elements that surround the vessel, and can also be controlled by a plasma struck inside the vessel. The pressure vessel 100 and its contents are inserted into a LPCVD furnace for deposition of the various layers of the present invention. LPCVD furnaces are well-known in the art and will not be further discussed.

A plurality of wafers 108, which may include product wafers or product and dummy wafers, are affixed to a boat 106 that is then inserted into the pressure vessel 100.

The plurality of wafers 108 are preferably made of a suitable substrate material 120 for the desired product fabrication. Substrate material 120 is preferably either amorphous or crystalline (including single crystal and polycrystalline). Suitable substrate materials 120 include, for example, silicon (Si), silicon dioxide ($SiO_2$), titanium nitride (TiN), titanium silicide ($TiSi_2$), cobalt silicide ($CoSi_2$), aluminum (Al), copper (Cu), tungsten (W), tungsten silicide ($WSi_2$), and other similar materials.

Figure 1B:
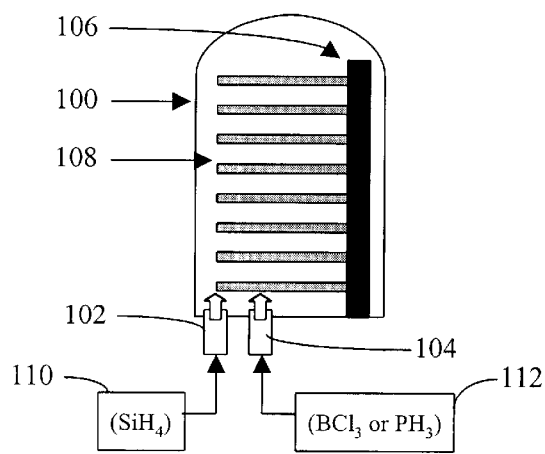
Figure 1B:
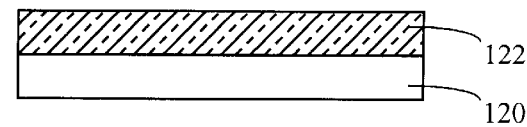

Referring now to FIG. 1B, once the wafers 108 are inserted into the pressure vessel 100, a doped silicon layer 122 is formed on a surface of the substrate material 120. The doped silicon layer' 122 is preferably formed via in-situ doping. In particular, silicon atoms are codeposited with precursor or dopant atoms on substrate material 120. This is preferably accomplished by appropriately pressurizing and heating pressure vessel 100 and then introducing silane ($SiH_4$) gas to provide a source of silicon atoms and a precursor gas having either boron trichloride ($BCl_3$) or phosphine ($PH_3$). A precursor gas having boron trochloride ($BCl_3$) is introduced if the doped silicon layer 122 is to be p-type and a precursor gas having phosphine (PH3) is introduced if the doped silicon layer 122 is to be n-type. Hence, doped silicon layer 122 can be formed with either n-type or p-type dopants.

Figure 1C:
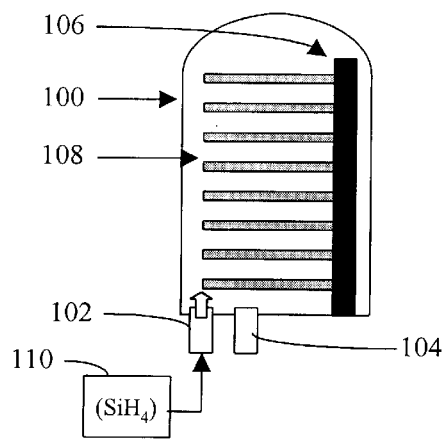
Figure 1C:
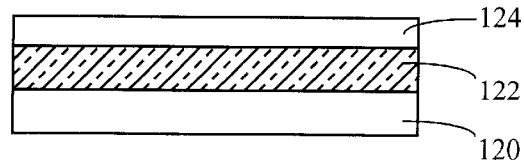

Referring now to FIG. 1C, a capping layer 124 is formed on doped silicon layer 122. Capping layer 124 is preferably made by depositing undoped silicon on the surface of doped silicon layer 122. The capping layer 124 is also formed on all of the remaining surfaces of wafers 108, pressure vessel 100, and boat 106. In this manner, all surfaces previously exposed to the in-situ doping process of the first doped silicon layer 122 will have a capping layer formed thereon. As will be described in more detail in connection with FIGS. 2 and 3, the formation of a capping layer 124 on all of the previously exposed surfaces reducing the autodoping effect to preferably substantially background levels. In this regard, the formation of capping layer 124 is preferably accomplished by discontinuing the introduction of the precursor gas having either boron trichloride ($BCl_3$) or phosphine ($PH_3$), while continuing the introduction of the silane gas ($SiH_4$). The continued introduction of the silane gas ($SiH_4$) in the absence of any precursor gases forms an undoped silicon capping layer 124, on all of the exposed surfaces in the pressure vessel including doped silicon layer 122. The continued introduction of silane gas ($SiH_4$) is maintained until the capping layer 124 has formed an appropriate thickness to reduce the effects of autodoping. Effective thickness ranges are discussed in connection with FIGS. 2 and 3, infra.

Referring now to FIG. 1D, a second doped silicon layer 126 may formed on capping layer 124. Similar to doped silicon layer 122, the second doped silicon layer 126 is also preferably formed via in-situ doping. More specifically, the second doped silicon layer can be formed by once again introducing a precursor gas into the pressure vessel 100, while continuing to introduce silane gas ($SiH_4$) As described above, the precursor gas can have either boron trichloride ($BCl_3$) or phosphine (PH3) therein to provide p-type or n-type dopants, respectively. In this regard doped silicon layers 122 and 126 can have opposite dopant characteristics. For example, if doped silicon layer 122 is formed using p-type dopant atoms (i.e., boron), then doped silicon layer 126 can be formed using n-type dopant atoms (i.e., phosphorus), or vice-versa.

The process shown and described in FIGS. 1A through 1D can be further repeated to build addition layers on top of second doped silicon layer 126. For example, once second doped silicon layer 126 is formed, a second capping layer similar to capping layer 124 can be formed thereon by once again discontinuing the introduction of the precursor gas, while continuing the introduction of the silane gas ($SiH_4$). A third doped silicon layer, which can be either p or n-type, can then be formed on the second capping layer by the above described processes, and so on. In this regard, the undoped silicon capping layer formed between two doped silicon layers is thin enough to reduce the effects of autodoping while maintaining the respective doped silicon layers in operative communication with each other. The term operative communication is defined herein to mean that the drift and diffusion mechanisms by which holes and electrons move through a silicon structure are operative and not substantially diminished. Hence, an undoped silicon capping layer according to the present invention between, for example, an n-type doped silicon layer and a p-type doped silicon layer does not substantially diminish the drift and diffusion characteristics necessary to preserve the operability of a junction formed between the p and n-type doped silicon layers.

Hence, an efficient continuous process of forming a semiconductor device having different types and/or concentrations of dopants but using a single furnace is possible because the capping layer 124 forms an autodoping barrier on all surfaces that have thereon one or more exposed doped silicon layers that may be the source of any autodoping atoms.

Figure 2:
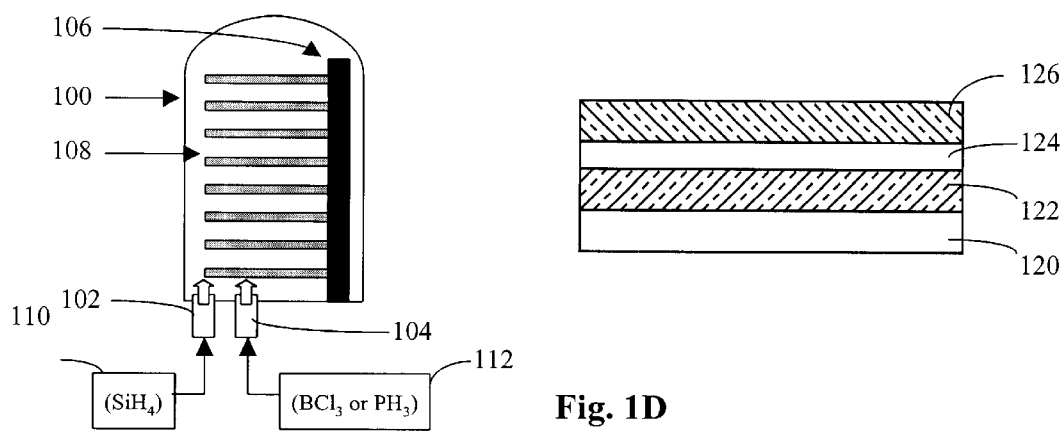
FIG. 2 is a graph illustrating thicknesses of various undoped silicon capping layers with reference to a 1000 Å phosphorus-doped (n-type) silicon layer.
Figure 2:
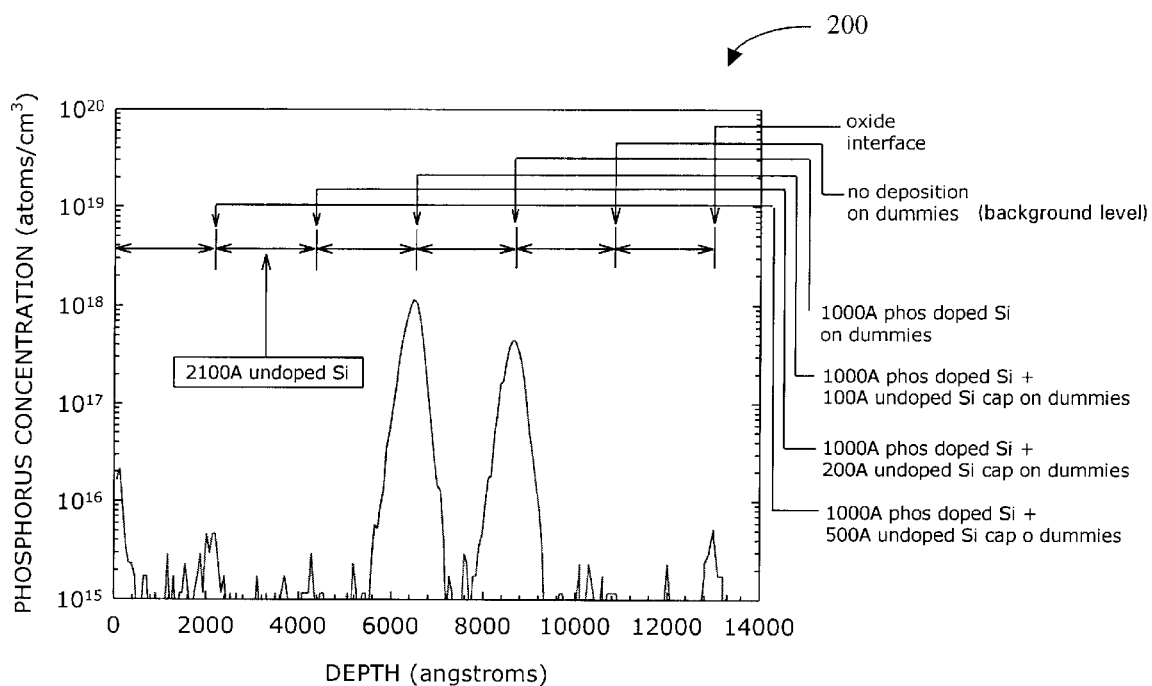
Figure 3:
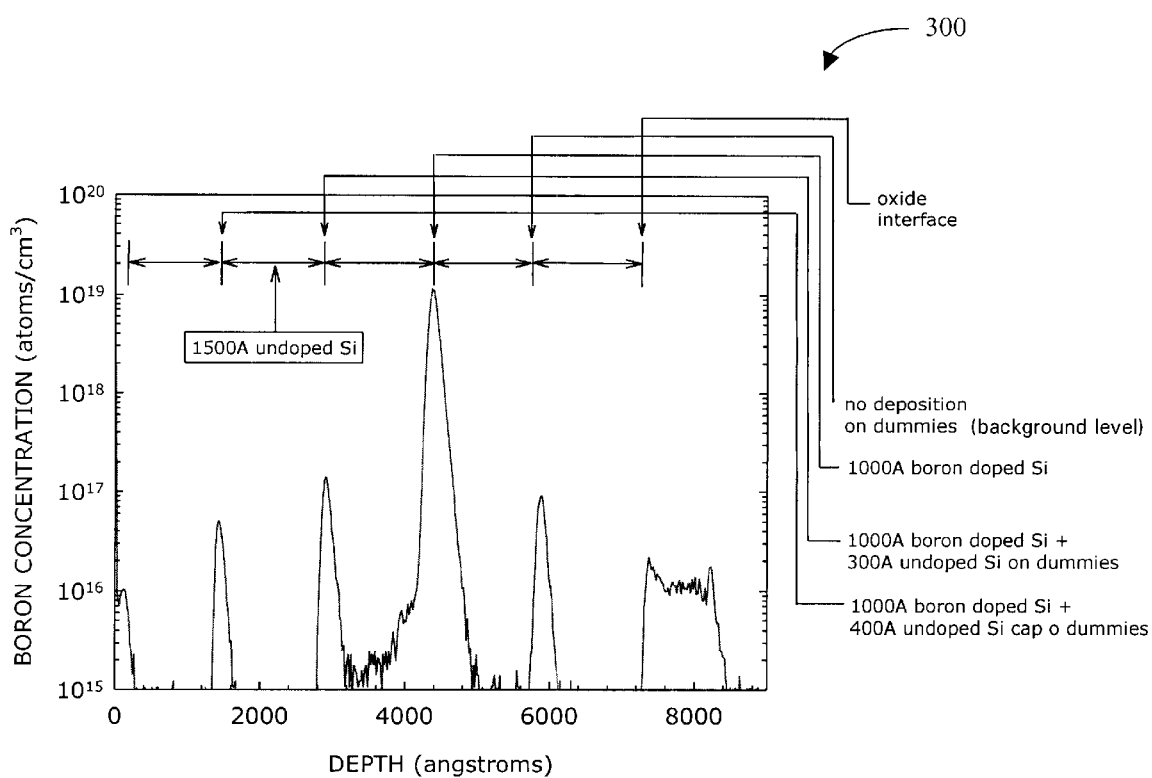
FIG. 3 is a graph illustrating thicknesses of various undoped silicon capping layers with reference to a 1000 Å boron-doped (p-type) silicon layer.

Referring now generally to FIGS. 2 and 3, the present discussion will focus on the thickness requirements of the undoped silicon capping layer of the present invention. The following procedure was used to determine the thickness of an undoped silicon capping layer necessary to prevent autodoping in the case of boron and phosphorus dopant atoms. In this regard, silicon wafers with 1000 Å of thermally grown $SiO_2$ were first prepared as test substrates. Prior to deposition on the test wafers, a full load of 150 dummy wafers was deposited with either heavily phosphorus or boron-doped silicon films 1000 Å thick. Doping concentrations were determined from previous depositions by concentration depth profiling by secondary ion mass spectrometry, or SIMS. The doping concentration in either phosphorus or boron-doped films was approximately $1 \times 10^{20}$ atoms/$cm^3$. After the first doped silicon deposition on the dummy wafers only (no test wafers), which also resulted in deposition on the quartz tube and boat, a second undoped silicon deposition of approximately 1500 Å thick on test and dummy wafers followed. By depth profiling the concentration of dopant in the second film on the test wafer, the extent of autodoping was established. The doped silicon depositions on the dummy wafers were then "capped" with undoped silicon by turning off the flow of precursor or dopant gases while continuing the flow of silane ($SiH_4$) gas for a brief time. The thickness of the undoped capping layer was determined by the deposition rate and are illustrated in, for example, FIGS. 2 and 3. The actual thicknesses and, therefore, deposition rates were determined by spectroscopic ellipsometry. By repeating this sequence of: (1) depositing a doped silicon layer followed by an undoped silicon capping layer on dummy wafers, and (2) depositing undoped silicon layers on test wafers, the same test wafer can have many sequenced deposition layers and the extent of autodoping in each layer can be determined.

Referring now to more specifically to FIG. 2, the results of capping phosphorus-doped (n-type) silicon depositions will now be discussed. In this regard, amorphous silicon doped to $1 \times 10^{20}$ atoms/$cm^3$ phosphorus was deposited at 550° C. by flowing 500 sccm (standard cubic centimeters) of $SiH_4$ and 32 sccm of 0.5% $PH_3$ diluted in He with 380 sccm of He carrier gas. Pressure in the tube was 400 mTorr and the resulting deposition rate was approximately 19.3 Å/minute. Undoped silicon was deposited at 550° C. by flowing 500 sccm of $SiH_4$ at 400 mTorr, and the resulting deposition rate was approximately 21.7 Å/minute. The resulting SIMS depth profile of 5 sequences of depositions on the test wafer is shown in graph 200 of FIG. 2. The two large peaks in FIG. 2 correspond to, respectively, the level of autodoping without any undoped silicon capping layer and with only a 100 Å undoped silicon capping layer. However, substantially only background levels of phosphorus are observed when a 200 Å or greater thickness undoped silicon cap is deposited after the doped silicon deposition. Hence, for a 1000 Å phosphorus-doped silicon layer, an undoped silicon capping layer having a thickness of 200 Å or greater is sufficient to reduce the effects of autodoping to a substantially background level.

Referring now to FIG. 3, the results of capping boron-doped (p-type) silicon depositions will now be discussed. In this regard, polycrystalline silicon doped to $1 \times 10^{20}$ atoms/$cm^3$ boron was deposited at 550° C. by flowing 500 sccm (standard cubic centimeters) of $SiH_4$ and 100 sccm of 0.5% $BCl_3$ diluted in He with 300 sccm of He carrier gas. Pressure in the quartz tube was 400 mTorr and the resulting deposition rate was approximately 32.1 Å/minute. Undoped silicon was deposited at 550° C. by flowing 500 sccm of $SiH_4$ at 400 mTorr and the resulting deposition rate was approximately 21.7 Å/minute. The resulting SIMS depth profile of the test wafer is shown in graph 300 of FIG. 3. In FIG. 3, it is evident that a 300 or 400 Å undoped (CMP) that is required after deposition of oxide insulating layers. Oxide layers isolate conductive layers from one another and enable additional depositions to be put down on top of these structures. Since the oxide deposition is ubiquitous, that is, it not only covers the silicon structures but also fills the valleys in between, chemo-mechanical polishing is employed to planarize this bumpy or uneven deposition before subsequent depositions can be placed thereon. Generally, chemo-mechanical polishing removes the oxide on top of the silicon structures (e.g., wires), but does not remove the structures themselves. However, due to the thinness of the oxide layer on top of the silicon structures, it is difficult to stop the chemo-mechanical polishing process at the atomic interface of silicon oxide and silicon interface (i.e., $SiO_2$/Si interface). Nevertheless, it is important that all of the oxide be fully removed from the top of the silicon structures to allow for further device fabrication. Hence, overpolishing is employed where a quantity of silicon of the silicon structure is also removed. The exact quantity of silicon removed by overpolishing depends on, at least partly, the uniformity of the oxide film deposition and the resolving power or accuracy of the chemo-mechanical polishing tool. Typical overpolish ranges include anywhere between approximately 200 and 1500 Å. After chemo-mechanical polishing, the resulting wafer is a planar sheet of alternating silicon wires and insulating oxide ($SiO_2$) portions. Hence, if the overpolish is set for at least 500 Å, the undoped silicon capping layer on either boron or phosphorus-doped silicon films is consumed leaving behind only the desired highly doped silicon film. As described above, this procedure is employed on appropriate silicon silicon capping layer is sufficient to decrease the effects of autodoping. Hence, for a 1000 Å boron-doped silicon layer, an undoped silicon capping layer having a thickness of 300 Å or greater is sufficient to reduce the effects of autodoping to a substantially background level.

Given the procedures outlined above, it is possible to determine the appropriate undoped silicon capping layer thickness for doped silicon layers having thicknesses of more or less than 1000 Å. For example, undoped silicon capping layer thicknesses of up to 500, 1000, or 5000 Å may be appropriate depending on the concentration and type of dopant present in the doped silicon layers.

It should also be noted that the undoped silicon capping layers can be advantageously consumed or removed during subsequent processing. For example, the formation of TiSi$_2$ wires to access, for example, a diode semiconductor structure, requires deposition of titanium (Ti) on the doped silicon (Si) films with undoped caps. Subsequent thermal processing of the wafers reacts the Ti with Si, forming low resistivity TiSi$_2$. Each unit of Ti thickness deposited consumes approximately 2 units of Si to form TiSi$_2$. Hence, a process that deposits, for example, 250 Å Ti consumes approximately 500 Å of undoped silicon to form TiSi$_2$. Hence, a 200 Å undoped silicon capping layer on a phosphorus-doped silicon layer or a 300 Å undoped silicon capping layer on a boron-doped silicon layer would be consumed by this process leaving only highly doped silicon in contact with the TiSi$_2$.

Another process that consumes or removes the undoped silicon capping layer is chemo-mechanical polishing layers that have been oxidized and preferably not every silicon layer.

Numerous electronic devices can be formed according to the present invention including resistors, capacitors, diodes, memory devices, and electro-optical devices. For example, one particular type of electronic device includes three-dimensional memory devices as disclosed in co-pending U.S. patent application Ser. No. 09/560,626 titled "Three-Dimensional Memory Array and Method of Fabrication," filed Apr. 28, 2000, which is hereby fully incorporated by reference. Another example includes nonvolatile memory devices as disclosed in U.S. Pat. No. 6,034,882 titled "Vertically Stacked Field Programmable Nonvolatile Memory and Method of Fabrication," issued on Mar. 7, 2000, which is hereby fully incorporated by reference. Still other examples include HBTs (heterojunction bipolar transistors) and TFTs (thin-film transistors), which can be formed by alternating layers of crystalline silicon (Si) with different doping types.

While the present invention has been illustrated by the description of embodiments thereof, and while the embodiments have been described in considerable detail, it is not the intention of the applicants to restrict or in any way limit the scope of the appended claims to such detail. Additional advantages and modifications will readily appear to those skilled in the art. For example, undoped silicon capping layer thicknesses in excess or 200 or 300 Å can be employed to reduce the effects of autodoping, depending on the thickness of the doped silicon layers. Therefore, the invention, in its broader aspects, is not limited to the specific details, the representative apparatus, and illustrative examples shown and described. Accordingly, departures can be made from such details without departing from the spirit or scope of the applicant's general inventive concept.

We claim:

1. A method of making a silicon-based electronic device comprising the steps of:
    forming a first doped silicon layer in a pressure vessel over a surface of a product wafer substrate material while introducing a precursor gas, the first doped layer comprising n-type or p-type silicon;
    without removing the substrate material from the pressure vessel, discontinuing introduction of the precursor gas and forming an undoped silicon capping layer on the first doped silicon layer, the undoped silicon capping layer having a thickness sufficient to reduce autodoping to approximately a back-ground level; and
    forming a next doped silicon layer on the undoped silicon capping layer, the next doped layer comprising p-type or n-type silicon, the type opposite the type of the first doped layer.

2. The method of claim 1 wherein the step of forming an undoped silicon capping layer comprises the step of depositing less than 5000 Angstroms of undoped silicon on the first doped silicon layer, and wherein the undoped silicon capping layer is thinner than the first doped layer.

3. The method of claim 2 wherein the step of forming an undoped silicon capping layer comprises the step of depositing less than 1000 Angstroms of undoped silicon on the first doped silicon layer.

4. The method of claim 2 wherein the step of forming an undoped silicon capping layer comprises the step of depositing less than 500 Angstroms of undoped silicon on the first doped silicon layer.

5. The method of claim 2 wherein the step of forming an undoped silicon capping layer comprises the step of depositing about 200 Angstroms of undoped silicon on the first doped silicon layer, wherein the precursor gas comprises phosphorus.

6. The method of claim 2 wherein the step of forming an undoped silicon capping layer comprises the step of depositing about 300 Angstroms of undoped silicon on the first doped silicon layer, wherein the precursor gas comprises boron.

7. The method of claim 2 wherein the step of forming a first doped silicon layer comprises the step of in-situ doping silicon with phosphorus; and
    wherein the undoped silicon capping layer has a thickness approximately equal to or greater than 200 Angstroms.

8. The method of claim 2 wherein the step of forming a first doped silicon layer comprises the step of in-situ doping silicon with phosphorus; and
    wherein the undoped silicon capping layer has a thickness approximately equal to 200 Angstroms.

9. The method of claim 2 wherein the step of forming a first doped silicon layer comprises the step of in-situ doping silicon with boron; and
    wherein the silicon capping layer has a thickness approximately equal to or greater than 300 Angstroms.

10. The method of claim 2 wherein the step of forming a first doped silicon layer comprises the step of in-situ doping silicon with boron; and
    wherein the an undoped silicon capping layer has a thickness approximately equal to 300 Angstroms.

11. A method of making a silicon-based electronic device comprising the steps of:
    forming a first doped layer over a substrate by in-situ doping silicon with n-type or p-type dopant atoms;
    forming an undoped silicon capping layer on the first doped layer, the silicon capping, layer having a thickness sufficient to reduce autodoping to approximately a background level; and
    forming a second doped layer on the capping layer by in-situ doping silicon with p-type or n-type dopant atoms, the dopant type the opposite of the first doped layer,
    wherein the steps of forming the first doped layer and forming the silicon capping layer take place without removing the substrate from a chamber.

12. The method of claim 11 wherein the silicon capping layer is thinner than the first doped layer.

13. The method ol claim 12 wherein the step of forming a first doped layer by in-situ doping silicon comprises the step of in-situ doping silicon with phosphorus; and wherein the silicon capping layer has a thickness approximately equal to or greater than 200 Angstroms.

14. The method of claim 12 wherein the step of forming a first doped layer by in-situ doping silicon comprises the step of in-situ doping silicon with phosphorus; and wherein the silicon capping layer has a thickness approximately equal to 200 Angstroms.

15. The method of claim 12 wherein the step of forming a first doped layer by in-situ doping silicon comprises the step of in-situ doping silicon with boron; and wherein the a silicon capping layer has a thickness approximately equal to or greater than 300 Angstroms.

16. The method of claim 12 wherein the step of forming a first doped layer by in-situ doping silicon comprises the step of in-situ doping silicon with boron; and wherein the a silicon capping layer has a thickness approximately equal to 300 Angstroms.

17. A continuous method of making a silicon-based electronic device comprising the steps of:

introducing at least one substrate wafer into a chemical vapor deposition chamber;

forming a first doped layer over the substrate wafer by introducing a first gas having silicon and a second gas having a p-type or n-type doping characteristic;

forming a silicon capping layer on the first doped layer by discontinuing the introduction of the second gas while continuing the introduction of the first gas; and forming a second doped material on the capping layer by introducing a third gas having an n-type or p-type doping characteristic while continuing to introduce the first gas, the doping characteristic type of the third pas opposite the doping characteristic type of the second gas, wherein the step of forming a first doped layer and the step of forming a silicon capping layer take place without removing the substrate from the chamber, and wherein the silicon capping layer has a thickness sufficient to reduce autodoping to approximately a background level.

18. The method of claim 17 wherein the silicon capping layer, when completed, is thinner than the first doped layer.

19. The method of claim 18 wherein the second gas comprises phosphorus; and wherein the step of forming a silicon capping layer by discontinuing the introduction of the second gas while continuing the introduction of the first as further comprises the step of continuing the introduction of the first gas until a silicon layer having a thickness approximately equal to or greater than 200 Angstroms is formed.

20. The method of claim 18 wherein the second gas comprises phosphorus, and wherein the step or forming a silicon capping layer by discontinuing the introduction of the second gas while continuing the introduction of the first gas further comprises the step of continuing the introduction of the first gas until a silicon layer having a thickness approximately equal to 200 Angstroms is formed.

21. The method of claim 18 wherein the step of introducing a second gas comprises boron; and wherein the step of forming a silicon capping layer by discontinuing the introduction of the second gas while continuing the introduction of the first gas further comprises the step of continuing the introduction of the first gas until a silicon layer having a thickness approximately equal to or greater than 300 Angstroms is formed.

22. The method of claim 18 wherein the second gas comprises boron; and wherein the step of forming a silicon capping layer by discontinuing the introduction of the second gas while continuing the introduction ol the first gas further comprises the step of continuing the introduction of the first gas until a silicon layer having a thickness approximately equal to 300 Angstroms is formed.

23. A method of reducing the effects of autodoping in a chemical vapor deposition furnace comprising the steps of:

forming an undoped silicon capping layer between a first in-situ doped silicon layer and a second in-situ doped silicon layer, wherein the forming of the undoped silicon capping layer comprises forming an undoped silicon capping layer having a thickness sufficient to reduce the effects of autodoping to substantially a background level while maintaining the first and second doped silicon layers in operative communication with each other, wherein the first doped layer is formed with an n-type dopant or a p-type dopant, and the second doped layer is formed with a p-type dopant or an n-type dopant, the type opposite the type of the first doped layer.

* * * * *